(12) United States Patent
Fujiwara

(10) Patent No.: US 7,964,477 B2
(45) Date of Patent: Jun. 21, 2011

(54) METHOD OF MANUFACTURING III NITRIDE CRYSTAL, III NITRIDE CRYSTAL SUBSTRATE, AND SEMICONDUCTOR DEVICE

(75) Inventor: Shinsuke Fujiwara, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 210 days.

(21) Appl. No.: 12/470,493

(22) Filed: May 22, 2009

(65) Prior Publication Data

US 2009/0298265 A1 Dec. 3, 2009

(30) Foreign Application Priority Data

May 28, 2008 (JP) ................................. 2008-139585

(51) Int. Cl.
*H01L 21/205* (2006.01)
*H01L 21/208* (2006.01)

(52) U.S. Cl. ......... 438/478; 257/E21.108; 257/E21.109; 257/E21.117; 257/E21.119; 257/E33.005

(58) Field of Classification Search .................. 438/478, 438/FOR. 267; 257/E21.108, E21.109, E21.117, 257/E21.119, E33.005; 117/58, 63, 101
See application file for complete search history.

(56) References Cited

U.S. PATENT DOCUMENTS

| | | | | |
|---|---|---|---|---|
| 5,200,022 A | * | 4/1993 | Kong et al. | 117/95 |
| 5,443,032 A | * | 8/1995 | Vichr et al. | 117/84 |
| 5,474,021 A | * | 12/1995 | Tsuno et al. | 117/97 |
| 6,994,903 B2 | * | 2/2006 | Hsu et al. | 428/141 |
| 2009/0278125 A1 | * | 11/2009 | Duan et al. | 257/49 |
| 2009/0298265 A1 | * | 12/2009 | Fujiwara | 438/478 |

FOREIGN PATENT DOCUMENTS

| | | |
|---|---|---|
| EP | 0 573 943 A1 | 12/1993 |
| EP | 0 589 464 A1 | 3/1994 |
| JP | 2005-162526 A | 6/2005 |
| JP | 2006-315947 A | 11/2006 |
| WO | WO-2008-059875 A1 | 5/2008 |

* cited by examiner

*Primary Examiner* — George Fourson
(74) *Attorney, Agent, or Firm* — James W. Judge

(57) ABSTRACT

Affords III-nitride crystals having a major surface whose variance in crystallographic plane orientation with respect to an {hkil} plane chosen exclusive of the {0001} form is minimal. A method of manufacturing the III-nitride crystal is one of: conditioning a plurality of crystal plates (10) in which the deviation in crystallographic plane orientation in any given point on the major face (10*m*) of the crystal plates (10), with respect to an {hkil} plane chosen exclusive of the {0001} form, is not greater than 0.5°; arranging the plurality of crystal plates (10) in a manner such that the plane-orientation deviation, with respect to the {hkil} plane, in any given point on the major-face (10*m*) collective surface (10*a*) of the plurality of crystal plates (10) will be not greater than 0.5°, and such that at least a portion of the major face (10*m*) of the crystal plates (10) is exposed; and growing second III-nitride crystal (20) onto the exposed areas of the major faces (10*m*) of the plurality of crystal plates (10).

6 Claims, 2 Drawing Sheets

METHOD OF MANUFACTURING III NITRIDE CRYSTAL, III NITRIDE CRYSTAL SUBSTRATE, AND SEMICONDUCTOR DEVICE

BACKGROUND OF THE INVENTION

1. Technical Field

The present invention relates to methods of manufacturing III-nitride crystals and III-nitride crystal substrates having a major surface whose variance in crystallographic plane orientation, with respect to an {hkil} plane that is a crystallographic plane chosen exclusive of the {0001} form, is slight (h, k, i and l herein being whole numbers, with the relationship i=−(h+k) holding—likewise hereinafter). The present invention also relates to methods of manufacturing semiconductor devices including such III nitride crystal substrates.

2. Description of the Related Art

Group-III nitride crystals, which are employed advantageously in light-emitting devices, electronic devices and semiconductor sensors, are ordinarily manufactured by growing crystal onto the major surface of a sapphire substrate having a (0001)-plane major surface, or onto a GaAs substrate having a (111) a-plane major surface, by means of a vapor-phase technique such as hydride vapor-phase epitaxy (HVPE) or metalorganic chemical vapor deposition (MOCVD), or by flux growth or other liquid-phase technique. Consequently, ordinarily obtained III-nitride crystals have a major surface whose crystallographic plane orientation is {0001}.

With light-emitting devices on substrates that are III-nitride crystal having a major surface whose crystallographic plane orientation is {0001}, and in which a multiquantum-well (MQW) structure as a light-emitting layer has been deposited on the major surface, the light-emission efficiency is compromised by spontaneous polarization that occurs within the light-emitting layer owing to the III-nitride crystal's <0001> oriented polarity. Consequently, the manufacture of III-nitride crystal having a major surface whose plane crystallographic orientation is other than {0001} is being sought.

The following several methods have been proposed as ways of creating gallium-nitride crystal having a surface plane orientation of choice, without influencing the crystallographic plane orientation of the major surface of the substrate.

Japanese Unexamined Pat. App. Pub. No. 2005-162526 (Patent Document 1) for example discloses a method in which a number of rectangular crystal boules are sliced from GaN crystal grown by vapor deposition, and meanwhile, a silicon oxide film is coated onto the surface of a separately readied sapphire substrate, and then a number of recesses reaching to the substrate are formed in the film, the numerous crystal boules are embedded into the recesses in a manner such that their top surfaces will have the same desired plane orientation of choice, and by vapor deposition with the crystal boules as seeds, gallium nitride crystal having a surface plane orientation of choice is grown.

Furthermore, Japanese Unexamined Pat. App. Pub. No. 2006-315947 (Patent Document 2) discloses a method in which a number of nitride semiconductor bars are arranged in such a way that the c faces of adjoining nitride semiconductor bars oppose each other and the m face of each nitride semiconductor bar is the upper face, and nitride semiconductor layers are formed onto the upper face of the thus arranged nitride semiconductor bars.

Patent Document 1: Japanese Unexamined Pat. App. Pub. No. 2005-162526
Patent Document 2: Japanese Unexamined Pat. App. Pub. No. 2006-315947

With the method in the just-noted Patent Document 1, however, inasmuch as growth of the GaN crystal is carried out with, as seeds, the boules of crystal GaN that have been embedded into the sapphire substrate, due to the disparity in thermal expansion coefficient between sapphire and GaN, fractures and strain occur in the GaN crystal when the crystal is cooled following the growth process, such that GaN crystal of superior crystallinity has not been obtainable.

Furthermore, if III-nitride crystal containing Al—for example, $Al_xGa_yIn_{1-x-y}N$ ($x>0$, $y\geq 0$, $x+y\leq 1$)—is grown by the method in above-noted Patent Document 1, because the Al precursor is not selective with respect to the silicon oxide film, the $Al_xGa_yIn_{1-x-y}N$ grows onto the silicon oxide film as well, and consequently $Al_xGa_yIn_{1-x-y}N$ crystal of superior crystallinity has not been obtainable.

With the method in just-noted Patent Document 2, meanwhile, inasmuch as the c-planes of the nitride semiconductor bars are set in opposition, nitride semiconductor layers having a chosen crystallographic plane orientation other than planes (such as the m-plane, for example) perpendicular to the c-plane have not been obtainable.

Moreover, the nitride semiconductor bars used in the method of above-noted Patent Document 2 are rectangular striplike slices of a nitride semiconductor wafer grown onto a dissimilar wafer, such as sapphire, SiC, silicon or GaAs, having a chemical composition that is of a different kind from that of the nitride semiconductor. In this case, the nitride semiconductor wafer grown onto the dissimilar wafer possesses significant crystal strain and warp, on account of which the variance in crystallographic plane orientation, with respect to the m-plane, across the major surface of nitride semiconductor bars sliced from such a nitride semiconductor wafer is considerable. For that reason, nitride semiconductor layers grown onto the m-plane of the plurality of nitride semiconductor bars also prove to have considerable variance in crystallographic plane orientation across the major surface with respect to the m-plane. Such inconsistency compromises the device properties of semiconductor devices that incorporate such nitride semiconductor layers, and is deleterious to production yields.

BRIEF SUMMARY OF THE INVENTION

An object of the present invention, to resolve the problems discussed above, is to make available a method of manufacturing III-nitride crystals, III-nitride crystal substrates, and semiconductor devices incorporating the III nitride crystal substrates, having a major surface whose variance in crystallographic plane orientation with respect to an {hkil} plane, being a crystallographic plane chosen exclusive of the {0001} form, is slight.

The present invention, in accordance with one aspect thereof, is a III-nitride crystal manufacturing method provided with: a step of slicing a plurality of crystal plates from a first III-nitride crystal and conditioning the plurality of crystal plates to deviation in crystallographic plane orientation in any given point on the major face of each crystal plate, with respect to an {hkil} plane being a crystallographic plane chosen exclusive of the {0001} form, of not greater than 0.5°; a step of arranging the plurality of crystal plates in a manner such that the plane-orientation deviation, with respect to the {hkil} plane, in any given point on the major-face collective surface of the plurality of crystal plates will be not greater than 0.5°, and such that at least a portion of the major face of each crystal plate is exposed; and a step of growing second III-nitride crystal onto the exposed areas of the major faces of the plurality of crystal plates in such a way as to incorporate and unify first crystal regions that grow onto the exposed areas of the major faces of each crystal plate, and second crystal regions that are regions where the first crystal regions merge with each other.

With a III-nitride crystal manufacturing method involving the present invention, in the step of conditioning the plurality of crystal plates, it is possible to have the deviation in crystallographic plane orientation in any given point on the major face of each crystal plate, with respect to an {hkil} plane, be not greater than 0.2°, and in the step of arranging the plurality of crystal plates, to have the plane-orientation deviation, with respect to the {hkil} plane, in any given point on the major-face collective surface of the plurality of crystal plates be not greater than 0.2°.

In addition, the present invention, in accordance with another aspect thereof, is a method of manufacturing a III-nitride crystal substrate from second III-nitride crystal obtained by the manufacturing method set forth above, the III-nitride crystal substrate manufacturing method being provided with a step of forming on the second III-nitride crystal major surfaces perpendicular to the growth axis of the second III-nitride crystal.

The present invention, in accordance with yet another aspect thereof, is also a method of manufacturing semiconductor devices incorporating a III-nitride crystal substrate obtained by the manufacturing method set forth above, the semiconductor device manufacturing method being provided with a step of preparing a III-nitride crystal substrate that includes the first crystal regions and the second crystal regions; and a step of forming semiconductor devices with the III-nitride crystal substrate.

The present invention affords a method of manufacturing III-nitride crystals, III-nitride crystal substrates, and semiconductor devices incorporating the III nitride crystal substrates, having a major surface whose crystallographic plane-orientation variance with respect to an {hkil} plane, being a crystallographic plane chosen exclusive of the {0001} form, is slight.

BRIEF DESCRIPTION OF THE SEVERAL VIEWS OF THE DRAWINGS

FIG. 1A is an oblique view summarily representing a step of conditioning a plurality of crystal plates; FIG. 1B is an oblique view summarily representing a step of arranging the plurality of crystal plates; and FIG. 1C is a sectional view summarily representing a step of growing III-nitride crystal, and a step of forming a major face on the III-nitride crystal.

Figure 1A:
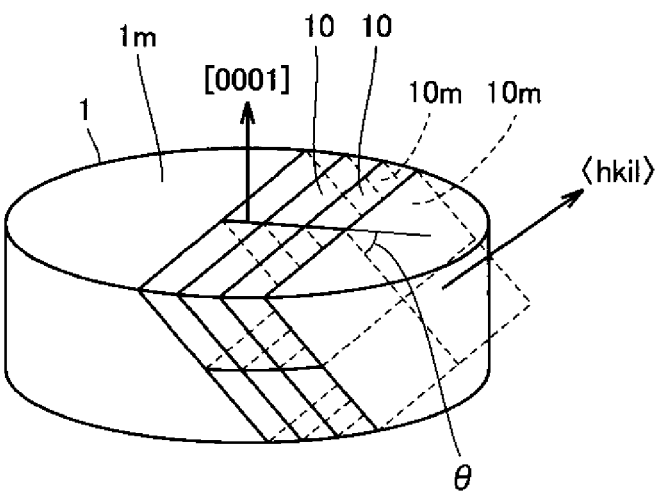
FIGS. 1A through 1C are outline diagrams illustrating one example of a method, involving the present invention, of manufacturing III-nitride crystal and III-nitride crystal substrates. Therein.

In the drawings, reference mark 1 indicates first III-nitride crystal; reference marks 1m, 10m, 20g, 20m, and 20n, major (sur)faces; reference mark 10, crystal plates; reference mark 10a, collective surface; reference mark 10t, edge faces; reference mark 20, second III-nitride crystal; reference mark 20p, III-nitride crystal substrate; reference mark 20s, first crystal region; reference mark 20t, second crystal region; reference mark 40, semiconductor devices; reference mark 41, semiconductor layer; reference mark 42, Schottky contact; reference mark 43, ohmic contact.

DETAILED DESCRIPTION OF THE INVENTION

In crystallography, in order to represent the crystallographic plane orientation of crystal faces, notation (Miller notation) such as (hkl) and (hkil) is used. The crystallographic plane orientation of crystal faces in crystals of the hexagonal crystal system, such as III-nitride crystal, is expressed by (hkil). Herein, h, k, i and l are whole numbers referred to as Miller indices, where the relationship $i=-(h+k)$ holds. The plane of the crystallographic plane orientation (hkil) is called the (hkil) plane. And the direction perpendicular to the (hkil) plane (the direction of a line normal to the (hkil) plane) is called the [hkil] direction. Meanwhile, "{hkil}" generically signifies crystallographic plane orientations comprehending (hkil) as well as each of its crystallographically equivalent plane orientations, and "<hkil>" generically signifies directions comprehending [hkil] as well as each of its crystallographically equivalent directions.

Embodying Mode 1

Figure 1B:
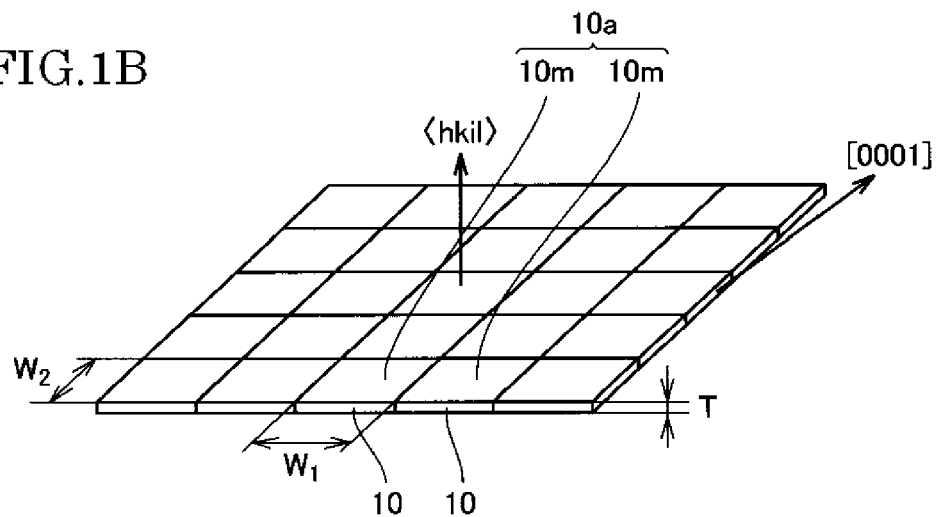
Figure 1C:
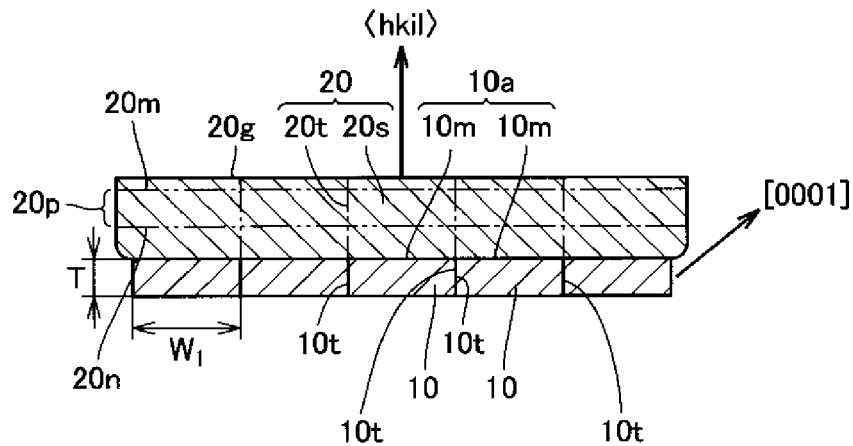

Reference is made to FIG. 1: One mode of embodying a III-nitride crystal manufacturing method involving the present invention provides a step (cf. FIG. 1A) of slicing a plurality of crystal plates 10 from a first III-nitride crystal 1 and conditioning the plurality of crystal plates 10 to a deviation in crystallographic plane orientation in any given point on the major face 10m of each crystal plate 10, with respect to an {hkil} plane being a crystallographic plane chosen exclusive of the {0001} form, of not greater than 0.5°, and provides a step (cf. FIG. 1B) of arranging the plurality of crystal plates 10 in a manner such that the plane-orientation deviation, with respect to the {hkil} plane, in any given point on the major-face 10m collective surface 10a of the plurality of crystal plates 10 will be not greater than 0.5°, and such that at least a portion of the major face 10m of each crystal plate 10 is exposed, and a step (cf. FIG. 1C) of growing second III-nitride crystal 20 onto the exposed areas of the major faces 10m of the plurality of crystal plates 10 in such a way as to incorporate and unify first crystal regions 20s that grow onto the exposed areas of the major faces 10m of each crystal plate 10, and second crystal regions 20t that are regions where the first crystal regions 20s merge with each other.

Crystal Plate Conditioning Step

Referring to FIG. 1A, the III-nitride crystal manufacturing method in the present embodying mode provides a step (crystal conditioning step) of slicing a plurality of crystal plates 10 from a first III-nitride crystal 1 and conditioning the plurality of crystal plates 10 to a deviation in crystallographic plane orientation in any given point on the major face 10m of each crystal plate 10, with respect to an {hkil} plane being a crystallographic plane chosen exclusive of the {0001} form, of not greater than 0.5°.

Conditioning a plurality of crystal plates 10 whose plane-orientation deviation in any given point on the major face 10m of each crystal plate 10, with respect to the {hkil} plane, is not greater than 0.5° makes it possible to grow onto the major face 10m of each crystal plate 10 crystal having a major surface of slight plane-orientation deviation. Herein, the plane-orientation deviation in any given point on the major face 10m of each crystal plate 10 can be measured by x-ray crystallography in arbitrary points on the major surface of each crystal plate.

Here, from the perspective of further minimizing the deviation in crystallographic plane orientation along the major surface of the crystal grown, with the plurality of crystal plates 10 it is preferable that the plane-orientation deviation in any given point on the major face 10m of each crystal plate 10, with respect to the {hkil} plane, be not greater than 0.2°.

The step of conditioning the crystal plates, while not being particularly limited, is for example carried out in the manner below. The first III-nitride crystal 1 from which the plurality of crystal plates 10 is sliced is not particularly limited, but in general implementations are common in which, employing vapor-phase deposition methods such as hydride vapor-phase epitaxy (HVPE), metalorganic chemical vapor deposition (MOCVD), and sublimation, or liquid-phase deposition methods such as flux growth, the material is grown using a dissimilar substrate—such as a sapphire substrate, an SiC substrate, or a GaAs substrate—whose chemical composition differs from that of III-nitride crystal (e.g., materials grown on these dissimilar substrates, or materials grown on substrates sliced from III-nitride crystal grown on such dissimilar substrates), wherein, with the major surface ordinarily being the {0001} plane, variance in crystallographic plane orientation across the major surface due to crystal strain is considerable.

With reference to FIG. 1A, a plurality of crystal plates 10 is sliced from the above-described III-nitride crystal 1. In this operation, slicing so that the major faces 10m of the plurality of crystal plates 10 have an inclination angle $\theta(0°<\theta\leq90°)$ from the major surface 1m of the first III-nitride crystal 1 yields a plurality of crystal plates 10 with major faces 10m having a crystallographic plane orientation near an {hkil} plane that is a crystallographic plane chosen exclusive of the {0001} form.

Although the angle of inclination $\theta$ between the major faces 10m of the crystal plates 10 and the major surface 1m, being a {0001} plane, of the first III-nitride crystal 1 is not particularly limited, from a perspective of reducing the polarity of the major faces 10m of the crystal plates 10, the angle preferably is greater than 5°, more preferably, greater than 40°.

Even with crystal plates 10 obtained in this way, the plane-orientation deviation, due to crystal strain, along the major face 10m is large. Consequently, the crystal plates 10 that are sliced off are each scaled (in implementations, as illustrated in FIG. 1, where the crystal plates are square tiles, width $W_1 \times$ width $W_2 \times$ thickness T) sufficiently small so that they may be conditioned to bring the variance in crystallographic plane orientation in any given point on the major face 10m of each crystal plate 10 to no greater than 0.5°. This means that the size of the crystal plates will differ depending on the size of the crystal strain; crystal plates of lower crystal strain can be scaled relatively larger.

The method of conditioning the sliced-off crystal plates 10 to bring the deviation in crystallographic plane orientation in any given point on the major face 10m of each crystal plate 10 to no greater than 0.5° is not particularly limited, but from the perspective of ease of the conditioning operation, a method that may be given as a preferable example is one whereby the crystallographic plane orientation in the central portion of a crystal plates' major face is characterized by x-ray crystallography, and the major faces on either side of the crystal plate are ground and/or polished to bring its crystallographic plane orientation, according to objectives, to less than 0.01° with respect to the chosen {hkil} plane. Herein, it is preferable that the grinding and/or polishing of the major faces on either side of the crystal plates makes them parallel to each other.

Another preferable, but not particularly limiting, qualification is that the edge faces of the crystal plates apart from their major faces be cut perpendicular to the major faces. Forming such edge faces facilities arranging the plurality of crystal plates so that the edge faces of each of the crystal plates contact each other. Here too, the edge faces are preferably ground and/or polished.

Crystal Plate Arranging Step

Referring now to FIG. 1B, the III-nitride crystal manufacturing method in the present embodying mode further provides a step of arranging the plurality of crystal plates 10 in a manner such that the plane-orientation deviation, with respect to the {hkil} plane, in any given point on the major-face 10m collective surface 10a of the plurality of crystal plates 10 will be not greater than 0.5°, and such that at least a portion of the major face 10m of each crystal plate 10 is exposed.

Arranging the plurality of crystal plates 10 in the manner just described makes it possible to grow, onto the exposed areas of the major faces 10m of the plurality of crystal plates 10, crystal having a major surface in which the variance in crystallographic plane orientation is minimal. Herein, the deviation in crystallographic plane orientation in any given point on the major-face 10m collective surface 10a of the plurality of crystal plates 10 can be characterized by x-ray crystallography on randomly selected points on the major-face 10m collective surface 10a of the plurality of crystal plates 10.

In this step as well, from a perspective of further minimizing deviation in the crystallographic plane orientation along the major face of the crystal that is grown, a plurality of crystal plates 10 whose plane-orientation deviation with respect to the {hkil} plane in any chosen point on the major face 10m of each crystal plate 10 is not greater than 0.2° preferably is arranged so that the plane-orientation variance with respect to the {hkil} plane in any chosen point over the collective surface of the plurality of crystal plates is no greater than 0.2°.

While the method of arranging the plurality of crystal plates 10 in a manner such that the deviation in crystallographic plane orientation, with respect to the {hkil} plane, in any given point on the major-face 10m collective surface 10a of the plurality of crystal plates 10 will be not greater than 0.5° is not particularly limited, one example that can be given is a method whereby the plurality of crystal plates 10 is arranged in a manner such that their major faces 10m parallel each other.

Furthermore, it is preferable that the plurality of crystal plates 10 be arranged in manner such that the [0001] direction in each crystal plate 10 is oriented in the same way. The major faces 10m of the plurality of crystal plates 10 thus arranged each have polarity of the same orientation as that of the others, therefore making it possible to grow, onto the exposed areas of the major faces 10m of the plurality of crystal plates 10, crystal having a major surface in which the variance in crystallographic plane orientation is even slighter.

Figure 2:
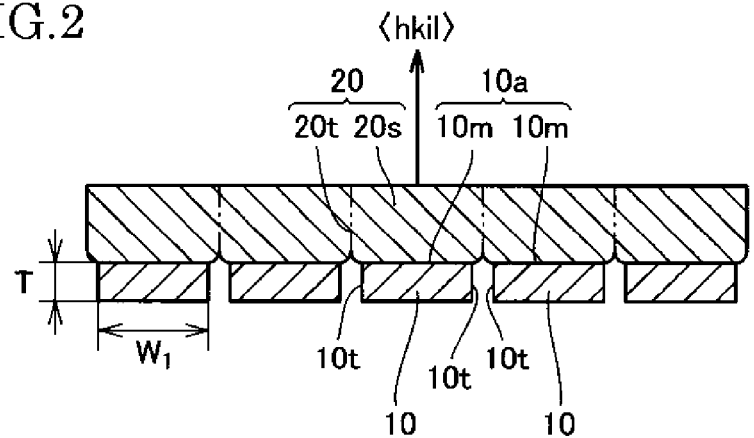
FIG. 2 is a sectional view summarily representing another example of a method, involving the present invention, of manufacturing III-nitride crystal.
Figure 3:
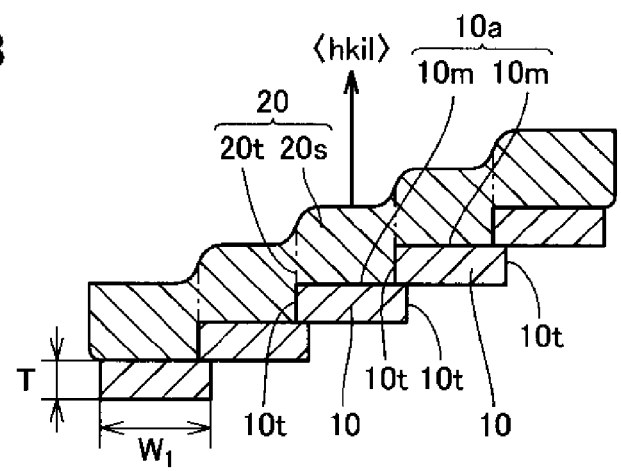
FIG. 3 is sectional view summarily representing still another example of a method, involving the present invention, of manufacturing III-nitride crystal.

Further, the method according to which the plurality of crystal plates 10 is arranged so that at least a portion of the major face 10m of each crystal plate 10 is exposed is not particularly limited provided that unified crystal can be grown onto the major-face exposed areas of the plurality of crystal plates 10, and they can be arranged so that the edge faces 10t of the plurality of crystal plates 10 are touching, as indicated in FIGS. 1B and 1C, or they can be arranged so that the edge faces 10t of the plurality of crystal plates 10 are spaced apart from each other, as indicated in FIG. 2, or the plurality of crystal plates 10 can be arranged in a manner such that portions of the major faces 10m overlap each other, as indicated in FIG. 3. It will be appreciated that in the FIG. 2 instance, in order to grow unified crystal onto the major-face exposed areas of the plurality of crystal plates 10, the separation between the edge faces 10t of the plurality of crystal plates 10 preferably is slight—for example, in implementations where the crystal that is grown is GaN crystal, preferably 200 μm or less.

Step of Growing Second III-Nitride Crystal

Referring now to FIG. 1C, the III-nitride crystal manufacturing method in the present embodying mode further provides a step (second III-nitride crystal growth step) of growing second III-nitride crystal 20 onto the exposed areas of the major faces 10m of the plurality of crystal plates 10 in such a way as to incorporate and unify first crystal regions 20s that grow onto the exposed areas of the major faces 10m of each crystal plate 10, and second crystal regions 20t that are regions where the first crystal regions 20s merge with each other.

Growing second III-nitride crystal in the manner just noted produces III-nitride crystal having an extensive major surface, yet with the variance in crystallographic plane orientation across that major surface being minimal.

In the step of growing second III-nitride crystal 20, with reference to FIG. 1C and FIGS. 2 and 3, second III-nitride crystal 20 is grown in a manner such that crystal (first crystal regions 20s) grows onto the exposed areas of the major faces 10m of the crystal plates 10, and the plural first crystal regions 20s merge and unify over the edge faces 10t of the a plurality of crystal plates 10. The regions where the first crystal regions 20s merge with each other are here termed "second crystal regions 20t." Inasmuch as these second crystal regions 20t are where the first crystal regions 20s merge, the regions' crystallinity is lower, and the dislocation density is higher, than that of the first crystal regions 20s. Consequently, the first crystal regions 20s and second crystal regions 20t can readily be distinguished by observing under cathodoluminescence the state of dislocation occurrence.

While the method whereby the second III-nitride crystal is grown is not particularly limited as long as it is one that allows the crystal to be grown in such a way that the plurality of first crystal regions merge and unify with one or more of the second crystal regions, examples that may be given include vapor-phase deposition methods such as HVPE and MOCVD, and liquid-phase deposition methods such as flux growth.

Since the deviation, from an {hkil} plane, in the crystallographic plane orientation of the major faces 10m of the plurality of crystal plates 10 is not greater than 0.5° (than 0.2°, preferably), the second III-nitride crystal grows in approximately an <hkil> direction.

Embodying Mode 2

Reference is made to FIG. 1C: One mode of embodying a III-nitride crystal substrate manufacturing method involving the present invention is a method of manufacturing a III-nitride crystal substrate 20p from second III-nitride crystal 20 obtained according to Embodying Mode 1, and provides a step (major-surface formation step) of forming on the second III-nitride crystal 20 major surfaces 20m, 20n perpendicular to the growth axis of the second III-nitride crystal 20. A manufacturing method such as this yields III-nitride crystal substrates 20p having extensive major surfaces 20m, 20n, yet in which variance in the crystallographic plane orientation along the surfaces 20m, 20n is minimal.

In the major-surface formation step of a III-nitride crystal substrate manufacturing method in the present embodying mode, the major surfaces 20m, 20n are formed on the second III-nitride crystal 20 perpendicular to its crystal growth axis by, specifically, slicing the second III-nitride crystal 20 along a plane perpendicular to the <hkil> direction that is its crystal growth axis, or grinding and/or polishing the major surface 20g of the as-grown second III-nitride crystal 20 to form a plane perpendicular to the <hkil> direction. A III-nitride crystal substrate 20p having major surfaces 20m, 20n perpendicular to the crystal growth axis is thereby obtained.

Meanwhile, slicing the second III-nitride crystal along a predetermined plane not perpendicular to the <hkil> direction that is the crystal's growth axis, or grinding and/or polishing the major surface of the as-grown second III-nitride crystal to form a predetermined plane not perpendicular to the <hkil> direction yields a III-nitride crystal substrate having a predetermined major surface not perpendicular to the growth axis of the crystal. The variance in crystallographic plane orientation along the major surface of such a III-nitride crystal substrate is minimal.

Embodying Mode 3

Figure 4:
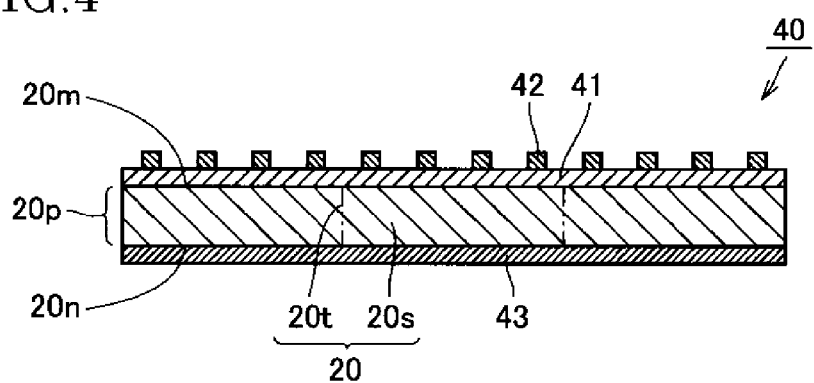
FIG. 4 is a sectional view summarily representing one example of semiconductor devices involving the present invention.

Reference is made to FIG. 4: One mode of embodying a semiconductor device manufacturing method involving the present invention is a method of manufacturing semiconductor devices incorporating a III-nitride crystal substrate 20p obtained according to Embodying Mode 2, and provides a step (III-nitride crystal substrate preparation step) of preparing a III-nitride crystal substrate 20p incorporating first crystal regions 20s and second crystal regions 20t, and a step (semiconductor device formation step) of forming semiconductor devices with the III-nitride crystal substrate 20p. A manufacturing method as such produces semiconductor devices of superior device characteristics, at favorable production yields.

Examples that may be given of such semiconductor devices include, but are not limited to: light-emitting devices such as light-emitting diodes and laser diodes; electronic devices such as rectifiers, bipolar transistors, field-effect transistors, and high electron mobility transistors (HEMTs); semiconductor sensors such as temperature sensors, pressure sensors, radiation sensors, and visible-blind ultraviolet detectors; and surface acoustic wave (SAW) devices, vibrators, resonators, oscillators, microelectromechanical system (MEMS) parts, and piezoelectric actuators.

In the III-nitride crystal substrate preparation step of the semiconductor device manufacturing method in the present embodying mode, a III-nitride crystal substrate 20p of Embodying Mode 2 is prepared. The III-nitride crystal substrate 20p thus incorporates first crystal regions 20s grown onto the exposed areas of the major faces 10m of the plurality of crystal plates 10, and second crystal regions 20t that are regions where the plurality of first crystal regions merge.

And in the semiconductor device formation step of the semiconductor device manufacturing method in the present embodying mode, the following semiconductor devices, for example, are formed. Referring to FIG. 4, a semiconductor layer 41 is formed onto the major surface 20m of the III-nitride crystal substrate 20p on one side, Schottky contacts 42 are formed onto the semiconductor layer 41 at a predetermined pitch, and an ohmic contact 43 is formed onto the major surface 20n of the III-nitride crystal substrate 20p on the other side, creating semiconductor devices 40. In this case, the Schottky contacts 42 are formed within the regions directly over the first crystal regions 20s, avoiding the regions directly over the second crystal regions 20t, of the III-nitride crystal substrate 20p. The semiconductor devices are therefore formed within the first crystal regions 20s of the III-nitride crystal substrate 20p.

EMBODIMENTS

1. Preparation of First GaN Crystal (First III-Nitride Crystal)

A 2-inch (50.8 mm) diameter GaN undersubstrate with a (0001)-plane major surface and a 2-mm radius of curvature (GaN undersubstrate A), and a 2-inch (50.8 mm) diameter GaN undersubstrate with a (0001)-plane major surface and a 5-mm radius of curvature (GaN undersubstrate B), obtained by slicing a GaN crystal grown by HVPE onto a 2-inch (50.8 mm) diameter sapphire substrate, were prepared.

First GaN crystal (first III-nitride crystal 1), of 12 mm thickness, was grown by HVPE onto the respective major surfaces of the thus-prepared GaN undersubstrate A and GaN undersubstrate B (cf. FIG. 1A). Here the first GaN crystal grown onto GaN undersubstrate A is termed "GaN crystal 1A," while the first GaN crystal grown onto GaN undersubstrate B is termed "GaN crystal 1B."

2. Conditioning of Crystal Plates

Referring to FIG. 1A, the GaN crystal 1A (first III-nitride crystal 1) was sliced along a plurality of planes having an inclination angle of 62° with respect to the crystal's (0001) major surface $1m$ to manufacture a plurality of 1-mm thick GaN crystal plates $A_0$ having major faces approximately on the (1-101) plane. In the same manner, the GaN crystal 1B was sliced along a plurality of planes having an inclination angle of 62° with respect to the crystal's (0001) major surface to manufacture a plurality of 1-mm thick GaN crystal plates $B_0$ having major faces approximately on the (1-101) plane.

The deviation, with respect to the (1-101) plane crystallographic plane orientation, in each of points arrayed at a 1-mm pitch within the (width $W_1$: 14 mm×width $W_2$: 50 mm) major faces of GaN crystal plates $A_0$ sliced from approximately the central portion of the GaN crystal A was determined by x-ray crystallography, whereupon the <11-20> direction deviation was 1.2° and the <0001> direction deviation was 0.25°. Likewise, the deviation with respect to the (1-101) plane crystallographic plane orientation in each of points arrayed at a 1-mm pitch within the (10 mm×50 mm) major faces of GaN crystal plates $B_0$ sliced from approximately the central portion of the GaN crystal B was determined to be a <11-20> direction deviation of 0.47° and a <0001> direction deviation of 0.10°.

Furthermore, the GaN crystal plates $A_0$ were diced into 11-mm squares to form a plurality of GaN crystal plates $C_0$. The deviation with respect to the (1-101) plane crystallographic plane orientation in a central point in the major faces of the GaN crystal plates $C_0$ was determined by x-ray crystallography, the major faces on either side of the GaN crystal plates $C_0$ were ground and polished to bring the deviation to under 0.01°, and then the edge faces of the GaN crystal plates $C_0$ were cut perpendicular to the major face, thereby producing GaN crystal plates C (crystal plates 10) of width $W_1$: 10 mm×width $W_2$: 10 mm×thickness T: 0.5 mm. In the same way, GaN crystal plates D (crystal plates 10) of width $W_1$: 10 mm×width $W_2$: 10 mm×thickness T: 0.5 mm were obtained from the GaN crystal plates $B_0$. Here, the deviation with respect to the (1-101) plane crystallographic plane orientation in each of points arrayed at a 1-mm pitch within the major faces of the GaN crystal plates C was determined by x-ray crystallography, whereat the <11-20> direction deviation was 0.25° and the <0001> direction deviation was 0.24°. Meanwhile, the deviation with respect to the (1-101) plane crystallographic plane orientation in each of points arrayed at a 1-mm pitch within the major faces of the GaN crystal plates D was determined to be a <11-20> direction deviation of 0.08° and a <0001> direction deviation of 0.07°.

In addition, the edge faces of the GaN crystal plates $A_0$ also were cut perpendicular to the major face, whereby GaN crystal plates A (crystal plates 10) of width $W_1$: 10 mm×width $W_2$: 50 mm×thickness T: 1.0 mm were obtained. And in the same way, GaN crystal plates B (crystal plates 10) of width $W_1$: 10 mm×width $W_2$: 50 mm×thickness T: 1.0 mm were obtained from the GaN crystal plates $B_0$. Here, the deviation with respect to the (1-101) plane crystallographic plane orientation in each of points arrayed at a 1-mm pitch within the major faces of the GaN crystal plates A was a <11-20> direction deviation of 1.1° and a <0001> direction deviation of 0.20°. Meanwhile, the deviation with respect to the (1-101) plane crystallographic plane orientation in each of points arrayed at a 1-mm pitch within the major faces of the GaN crystal plates B was a <11-20> direction deviation of 0.45° and a <0001> direction deviation of 0.07°.

3. Arranging of Crystal Plates

Referring to FIG. 1B, twenty-five GaN crystal plates C (crystal plates 10) were arranged five to a side both lengthwise and widthwise, in a manner such that their major faces were parallel and such that their edge faces were adjoining. In this situation, the deviation with respect to the (1-101) plane crystallographic plane orientation in each of points arrayed at a 1-mm pitch within the major-face $10m$ collective surface $10a$ of the twenty-five GaN crystal plates C proves to be a <11-20> direction deviation of 0.25° and a <0001> direction deviation of 0.24°. And in the same way, twenty-five GaN crystal plates D were arranged five to a side both lengthwise and widthwise. In this situation, the deviation with respect to the (1-101) plane crystallographic plane orientation in each of points arrayed at a 1-mm pitch within the major-face $10m$ collective surface $10a$ of the twenty-five GaN crystal plates D proves to be a <11-20> direction deviation of 0.08° and a <0001> direction deviation of 0.07°.

Also, five of the GaN crystal plates A (width $W_1$: 10 mm×width $W_2$: 50 mm×thickness T: 1 mm) were laid out with the five along the $W_1$ direction in a manner such that their major faces were parallel and such that their edge faces were adjoining. In this situation, the deviation with respect to the (1-101) plane crystallographic plane orientation in each of points arrayed at a 1-mm pitch within the major-face $10m$ collective surface $10a$ of the five GaN crystal plates A turns out to be a <11-20> direction deviation of 1.1° and a <0001> direction deviation of 0.20°. In turn, five of the GaN crystal plates B (width $W_1$: 10 mm×width $W_2$: 50 mm×thickness T: 1 mm) were also laid out. In this situation, the deviation with respect to the (1-101) plane crystallographic plane orientation in each of points arrayed at a 1-mm pitch within the major-face $10m$ collective surface $10a$ of the five GaN crystal plates B turns out to be a <11-20> direction deviation of 0.45° and a <0001> direction deviation of 0.07°.

4. Growth of Second GaN Crystal (Second III-Nitride Crystal) and Manufacture of GaN Crystal Substrate Referring to FIG. 1C, GaN crystal 2C, being second GaN crystal (second III-nitride crystal 20), was grown by HVPE onto the major faces 10m of the twenty-five GaN crystal plates C (crystal plates 10). This GaN crystal 2C was sliced through planes parallel to the (1-101) plane to manufacture a 12-mm thick GaN crystal substrate C (III-nitride crystal substrate) having major surfaces approximately on the (1-101) plane. And in the same way, GaN crystal 2D was grown onto the major face 10m of the twenty-five GaN crystal plates D (crystal plates 10), and a 12-mm thick GaN crystal substrate D (III-nitride crystal substrate) having major surfaces approximately on the (1-101) plane was manufactured from this GaN crystal 2D.

The deviation with respect to the (1-101) plane crystallographic plane orientation in each of points arrayed at a 1-mm pitch within the major surface 20m of the GaN crystal substrate C (III-nitride crystal substrate 20p) was a <11-20> direction deviation of 0.25° and a <0001> direction deviation of 0.26°. Meanwhile, the deviation with respect to the (1-101) plane crystallographic plane orientation in each of points arrayed at a 1-mm pitch within the major surface 20m of the GaN crystal substrate D was a <11-20> direction deviation of 0.08° and a <0001> direction deviation of 0.08°.

Also, GaN crystal 2A, being second GaN crystal (second III-nitride crystal 20), likewise as just described was grown by HVPE onto the major faces of the five GaN crystal plates A, and this GaN crystal 2A was sliced through planes parallel to the (1-101) plane to manufacture a 12-mm thick GaN crystal substrate A (III-nitride crystal substrate) having major surfaces approximately on the (1-101) plane. And in the same way, GaN crystal 2B, being second GaN crystal (second III-nitride crystal 20), was grown onto the major faces of the five GaN crystal plates B, and this GaN crystal 2B was sliced through planes parallel to the (1-101) plane to manufacture a 12-mm thick GaN crystal substrate B (III-nitride crystal substrate) having major surfaces approximately on the (1-101) plane.

The deviation with respect to the (1-101) plane crystallographic plane orientation in each of points arrayed at a 1-mm pitch within the major surface 20m of the GaN crystal substrate A (III-nitride crystal substrate 20p) was a <11-20> direction deviation of 1.3° and a <0001> direction deviation of 1.5°. Meanwhile, the deviation with respect to the (1-101) plane crystallographic plane orientation in each of points arrayed at a 1-mm pitch within the major surface 20m of the GaN crystal substrate B was a <11-20> direction deviation of 0.5° and a <0001> direction deviation of 0.6°.

Thus conditioning a plurality of crystal plates in which the deviation in crystallographic plane orientation in any given point on the major faces of the crystal plates, with respect to an {hkil} plane was not greater than 0.5° (preferably not greater than 0.2°), arranging the plurality of crystal plates in a manner such that the plane-orientation deviation, with respect to the {hkil} plane, in any given point on the major-face collective surface of the plurality of crystal plates was not greater than 0.5° (preferably not greater than 0.2°), and such that at least a portion of the major faces of the crystal plates was exposed, and growing second III-nitride crystal onto the exposed areas of the major faces of the plurality of crystal plates produced III-nitride crystal and III-nitride crystal substrates having major surfaces of minimal variance in crystallographic plane orientation with respect to the {hkil} plane.

Herein, in conditioning the GaN crystal plates (crystal plates 10) in the present embodiment, adjustment whereby the tilt angle (meaning the angle of deviation from the <hkil> direction, ditto hereinafter) of the major faces of the crystal plates was reduced was carried out; adjustment whereby the twist angle (meaning the angle of torsional deviation in the <hkil> direction, ditto hereinafter) of the major faces of the crystal plates was reduced was not carried out. This is because it is the tilt angle that largely influences the properties of III-nitride semiconductor layers (III-nitride crystal layers) formed onto the plates. Of course, adjustment to reduce the twist angle should be carried out according to need. For that, the adjustment to reduce the crystal-plate twist angle should be made when cutting the edge faces of the crystal plates.

It should be noted that measuring the electroconductivity (using an EC-80 made by Napukon K. K.) of the obtained GaN crystal substrates A, B, C and D globally across their major surfaces verified a high electroconductivity of 0.002 Ωcm. This is believed to be because oxygen contained in the HVPE growth-ambient gas is taken into the (1-101) crystal-growth plane with a high efficiency.

5. Manufacture of Semiconductor Devices

Referring to FIG. 4, an n-type GaN layer (semiconductor layer 41) of 15 μm thickness and $1 \times 10^{16}$ cm$^{-3}$ carrier concentration was formed by MOCVD onto the major surface 20m of the GaN crystal substrate C (III-nitride crystal substrate 20p) on one side. Schottky contacts 42 of 450 μm diameter, made from Au, were formed by vacuum evaporation deposition onto the n-type GaN layer (semiconductor layer 41) at a 2 mm pitch. In this case, the Schottky contacts 42 were formed within the regions directly over the first crystal regions 20s, avoiding the regions directly over the second crystal regions 20t, of the GaN crystal substrate C (III-nitride crystal substrate 20p). Further, an ohmic contact 43 made from Ti/Al was formed onto the major surface 20n of the GaN crystal substrate C (III-nitride crystal substrate 20p) on the other side. In this way, semiconductor devices C (semiconductor devices 40) were produced. A reverse voltage was applied across the Schottky contacts 42 and ohmic contact 43 of the semiconductor devices C to test the withstand voltage performance of the semiconductor devices.

When a withstand voltage of not less than 1000 V was taken to be a conforming product, 295 chips out of 400 chips were conforming products, for a product yield of 74%. Meanwhile, when a withstand voltage of not less than 500 V was taken to be a conforming product, 385 chips out of 400 chips were conforming products, for a product yield of 96%.

In the same manner as just described, semiconductor devices D were manufactured utilizing the GaN crystal substrate D, semiconductor devices A were manufactured utilizing the GaN crystal substrate A, and semiconductor devices B were manufactured utilizing the GaN crystal substrate B.

With regard to the semiconductor devices D, when a withstand voltage of not less than 1000 V was taken to be a conforming product, 385 chips out of 400 chips were conforming products, for a product yield of 96%, and when a withstand voltage of not less than 500 V was taken to be a conforming product, 395 chips out of 400 chips were conforming products, for a product yield of 99%.

With regard to the semiconductor devices A, when a withstand voltage of not less than 1000 V was taken to be a conforming product, 12 chips out of 400 chips were conforming products, for a product yield of 3%, and when a withstand voltage of not less than 500 V was taken to be a conforming product, 52 chips out of 400 chips were conforming products, for a product yield of 13%.

With regard to the semiconductor devices B, when a withstand voltage of not less than 1000 V was taken to be a conforming product, 84 chips out of 400 chips were conforming products, for a product yield of 21%, and when a withstand voltage of not less than 500 V was taken to be a conforming product, 350 chips out of 400 chips were conforming products, for a product yield of 87%.

As set forth above, with larger variance in crystallographic plane orientation along the major surface of a III-nitride crystal substrate within semiconductor devices, the product yields of the semiconductor devices are severely compromised. This is believed to be because if variance in crystallographic plane orientation along the major surface of a III-nitride crystal substrate is great, macro-steps occur in the growth plane of the semiconductor layers grown onto the substrate's major surface, which is detrimental to the morphology of the crystal growth plane in terms of its planarity.

As set forth above, when the standard for conforming products is a withstand voltage of not less than 500 V, for III-nitride crystal substrates where the major surface is made the (1-101) plane, if the variance, with respect to the (1-101) plane, in crystallographic plane orientation across the major surface is not greater than 0.5°, the semiconductor device yields are heightened. Likewise, for III-nitride substrates where the major surface is made the (11-22) plane or the (1-100) plane, the variance, with respect to the (11-22) plane or (1-100) plane, in crystallographic plane orientation across the major surface should be not greater than 0.5°.

And if the standard for conforming products is a withstand voltage of not less than 1000 V, for III-nitride crystal substrates where the major surface is made the (1-101) plane, if the variance, with respect to the (1-101) plane, in crystallographic plane orientation across the major surface is not greater than 0.2°, the semiconductor device yields are heightened. Likewise, for III-nitride substrates where the major surface is made the (11-22) plane or the (1-100) plane, the variance, with respect to the (11-22) plane or (1-100) plane, in crystallographic plane orientation across the major surface should be not greater than 0.2°.

The presently disclosed embodying modes and embodiment examples should in all respects be considered to be illustrative and not limiting. The scope of the present invention is set forth not by the foregoing description but by the scope of the patent claims, and is intended to include meanings equivalent to the scope of the patent claims and all modifications within the scope.

What is claimed is:

1. A III-nitride crystal manufacturing method provided with:
   a step of slicing a plurality of crystal plates from a first III-nitride crystal and conditioning the plurality of crystal plates to a deviation in crystallographic plane orientation in any given point on the major face of each crystal plate, with respect to an {hkil} plane being a crystallographic plane chosen exclusive of the {0001} form, of not greater than 0.5°;
   a step of arranging the plurality of crystal plates in a manner such that the plane-orientation deviation, with respect to the {hkil} plane, in any given point on the major-face collective surface of the plurality of crystal plates is not greater than 0.5°, and such that at least a portion of the major face of each crystal plate is exposed; and
   a step of growing second III-nitride crystal onto the exposed areas of the major faces of the plurality of crystal plates in such a way as to incorporate and unify first crystal regions that grow onto the exposed areas of the major faces of each crystal plate, and second crystal regions that are regions where the first crystal regions merge with each other.

2. A III-nitride crystal manufacturing method as set forth in claim 1, wherein:
   in said step of conditioning the plurality of crystal plates, the deviation in crystallographic plane orientation in any given point on the major face of each crystal plate, with respect to an {hkil} plane, is not greater than 0.2°; and
   in the step of arranging the plurality of crystal plates, the plane-orientation deviation, with respect to the {hkil} plane, in any given point on the major-face collective surface of the plurality of crystal plates is not greater than 0.2°.

3. A method of manufacturing a III-nitride crystal substrate from second III-nitride crystal obtained by a manufacturing method as set forth in claim 1, the III-nitride crystal substrate manufacturing method being provided with a step of forming on the second III-nitride crystal major surfaces perpendicular to the growth axis of the second III-nitride crystal.

4. A method of manufacturing a III-nitride crystal substrate from second III-nitride crystal obtained by a manufacturing method as set forth in claim 2, the III-nitride crystal substrate manufacturing method being provided with a step of forming on the second III-nitride crystal major surfaces perpendicular to the growth axis of the second III-nitride crystal.

5. A method of manufacturing semiconductor devices incorporating a III-nitride crystal substrate obtained by a manufacturing method as set forth in claim 3, the semiconductor device manufacturing method being provided with:
   a step of preparing a III-nitride crystal substrate that includes the first crystal regions and the second crystal regions; and
   a step of forming semiconductor devices with the III-nitride crystal substrate.

6. A method of manufacturing semiconductor devices incorporating a III-nitride crystal substrate obtained by a manufacturing method as set forth in claim 4, the semiconductor device manufacturing method being provided with:
   a step of preparing a III-nitride crystal substrate that includes the first crystal regions and the second crystal regions; and
   a step of forming semiconductor devices with the III-nitride crystal substrate.

* * * * *